US000001267H

United States Statutory Invention Registration [19]

[11] Reg. Number: H1267

Boyd

[43] Published: Dec. 7, 1993

[54] INTEGRATED CIRCUIT AND LEAD FRAME ASSEMBLY

[76] Inventor: Melissa D. Boyd, 1141 NW. Charlemagne Pl., Corvallis, Oreg. 97330

[21] Appl. No.: 549,504

[22] Filed: Jul. 5, 1990

[51] Int. Cl.[5] ..... H01L 23/48

[52] U.S. Cl. ..... 257/666; 257/673; 257/690; 257/700

[58] Field of Search ..... 357/74, 75, 70

[56] References Cited

U.S. PATENT DOCUMENTS

| | | | |
|---|---|---|---|
| 3,902,148 | 8/1975 | Drees et al. | 257/669 |
| 4,078,980 | 3/1978 | Harris et al. | 204/129.3 |
| 4,120,759 | 10/1978 | Asami et al. | 205/82 |
| 4,209,355 | 6/1980 | Burns | 156/630 |
| 4,510,017 | 4/1985 | Barber | 156/659.1 |
| 4,613,891 | 9/1986 | Ng et al. | 257/777 |
| 4,647,959 | 3/1987 | Smith | 357/74 |
| 4,714,517 | 12/1987 | Malladi et al. | 156/629 |
| 4,941,033 | 7/1990 | Kishida | 357/75 |

FOREIGN PATENT DOCUMENTS

| | | | |
|---|---|---|---|
| 2117564 | 10/1983 | United Kingdom | 357/75 |

*Primary Examiner*—Bernarr E. Gregory

[57] ABSTRACT

An integrated circuit (IC) and lead frame assembly comprises a first TAB segment having a plurality of leads having inner and outer ends. The inner ends are connected to bumps formed in a square pattern adjacent the periphery of the IC. A second TAB segment includes a plurality of leads having inner and outer ends. The inner ends are connected to a second set of bumps formed on the IC inwardly from the first set. The outer ends of the leads on the second TAB segment are connected to traces on the first TAB segment which are interleaved between the leads on the first TAB segment. The outer ends of the traces and leads on the first TAB segment thus connect to all of the IC bumps. This arrangement increases the number of connections which can be made to the IC.

17 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

INTEGRATED CIRCUIT AND LEAD FRAME ASSEMBLY

BACKGROUND OF THE INVENTION

1. Field of the Invention

The present invention relates to integrated circuit and lead frame assemblies and more particularly, to such assemblies which are implemented in a tape automated bonding (TAB) process.

2. Description of the Related Art

Tape automated bonding (TAB) is a technique for connecting conductive leads to the electrical contacts on an integrated circuit chip, known as a die. When such leads are so connected, they can be used to interconnect the integrated circuit with additional circuitry. Typically a strip of film is divided into a plurality of adjacent rectangular segments, each of which has a plurality of conductive leads etched thereon. The leads in each segment are referred to as a lead frame. A die mounted on a central portion of each lead frame is electrically connected to the inner ends of the leads in the frame in a known manner. When so assembled, the film or tape upon which the die are mounted may be wound onto reels prior to additional processing, testing and the like. After final testing, the tape is cut into individual TAB segments, each of which contains a die and an associated lead frame.

Typically the leads are arranged so that the inner extremities thereof define a predetermined rectangular pattern which corresponds to a substantially identical pattern of contacts or bumps on the integrated circuit die to which each of the leads is connected. The outer extremity of each lead may thus be used to connect the integrated circuit to other components. TAB bonding is limited in the number of leads which can be routed to an integrated circuit (IC) due to processes in fabricating the TAB tape which limit the spacing of the leads. This is a particular problem on some integrated circuits which can require as many as 250 or more leads. It would be desirable to increase the number of lead connections which can be made to an integrated circuit.

SUMMARY OF THE INVENTION

An integrated circuit assembly comprises an integrated circuit having first and second sets of contact pads mounted thereon. A first lead frame comprises a substantially planar array of leads and has the inner extremities thereof connected to the first set of contact pads. In the central portion of the lead frame an opening is defined by the inner extremities of the leads. A second lead frame has a plurality of leads which extend through the opening and which are connected to the second set of contact pads.

A method of creating such an assembly is also provided.

It is a general object of the present invention to provide an integrated circuit and lead frame assembly which provides an increase in the number of lead connections which can be made to an integrated circuit.

It is a more specific object of the present invention to provide such an assembly in which two TAB lead frames are connected to an integrated circuit.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
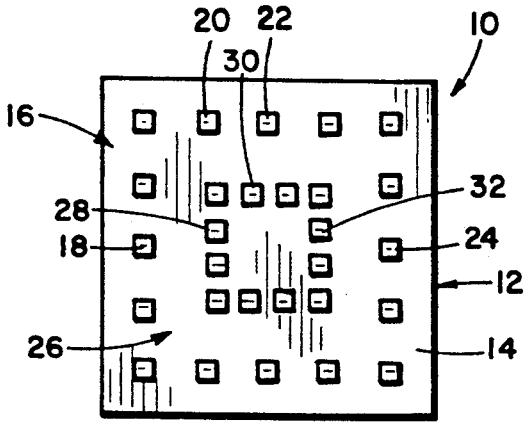
FIG. 1 is a plan view of an integrated circuit constructed in accordance with the present invention.

Indicated generally at 10 in FIG. 1 is an integrated circuit die which makes up a portion of the preferred embodiment of the present invention. The die includes a body 12 which incorporates a silicon wafer (not visible) having the integrated circuit fabricated therein in a known manner. The body includes an upper surface 14 which is coated with a passivation layer to protect the integrated circuit.

A first set of contact pads 16 comprise a plurality of bumps, like bumps 18, 20, 22, 24, which are formed in a square adjacent the perimeter of die 10. A second set of contact pads, indicated generally at 26, includes a plurality of bumps, like bumps 28, 30, 32, which are formed in a square concentric with the square formed by the contact pads in first set 16.

The bumps in each of sets 16, 26 comprise gold posts which extend above passivation surface 14 approximately 1 mil to provide a mechanical stand-off from surface 14 for connecting leads thereto. Each of the bumps is electrically connected to internal regions of the integrated circuit in die 10. Die 10, including the bumps formed thereon, is fabricated utilizing a well known process. It is to appreciated that the present invention may also be implemented with an unbumped die.

Figure 2:
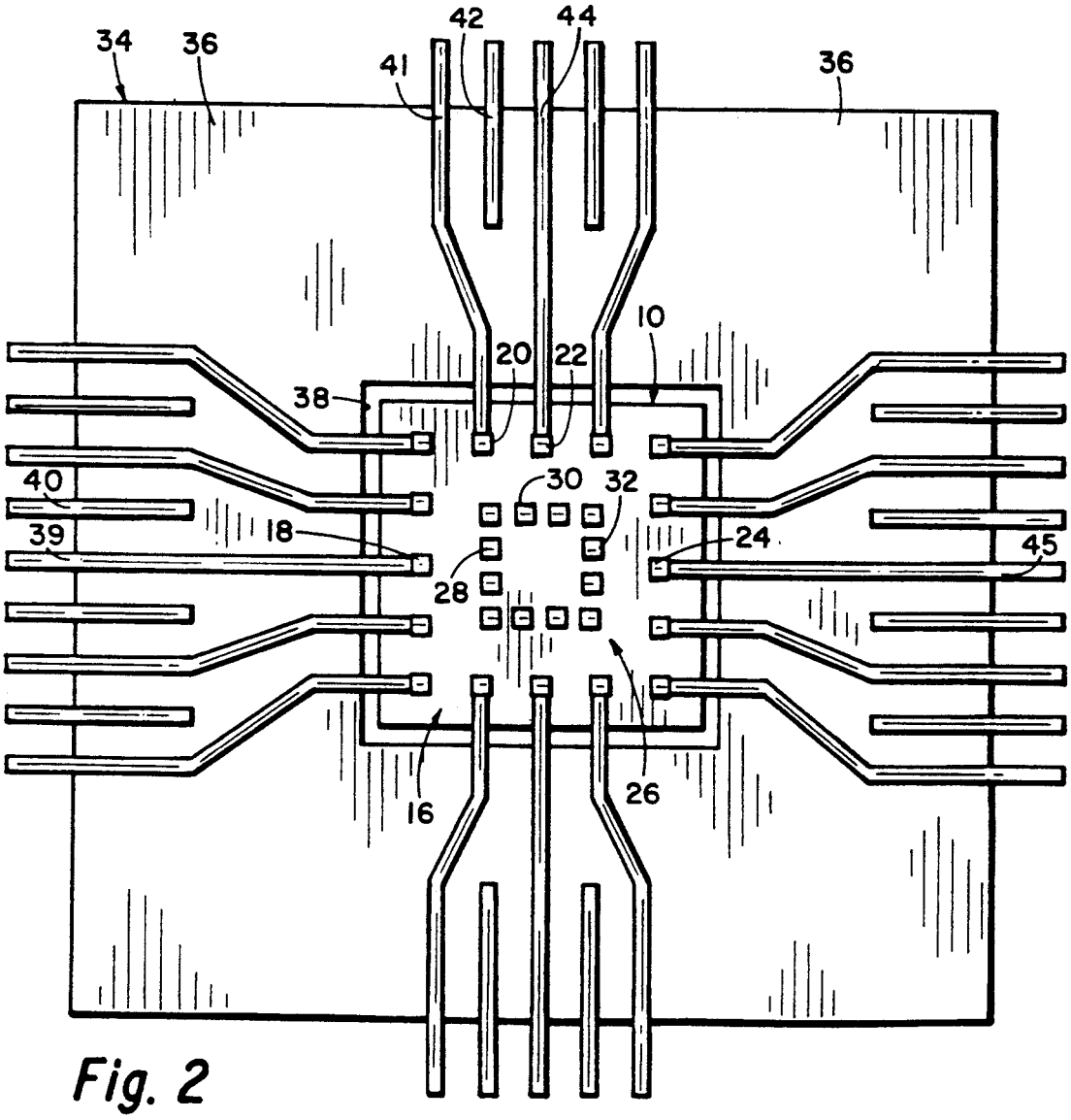
FIG. 2 is a plan view of a first lead frame connected to the integrated circuit of FIG. 1.

In FIG. 2, die 10 is shown interconnected with a first lead frame 34. The lead frame is supported on a square, substantially planar base 36 having a central square opening 38 therethrough. Base 36 is made from a polyimide film. Polyester or glass-reinforced epoxy films are equally suitable as a material for base 36. Lead frame 34 includes a plurality of conductive leads, like leads 39, 40, 41, 42, 44, 45, which are connected to and supported by base 36. The leads, like leads 39–45, extend over the outer edge of base 36 as shown. Some of the leads extend inwardly to a bump, like lead 41 extends to bump 20, on die 10. Others of the leads, like lead 42, extend inwardly part way to the edge of opening 38 in base 36. The short leads, like leads 40, 42 are referred to herein as traces. The long leads, like leads 41, 44, 45, include inner ends which are connected to the bumps and which form an opening in the lead frame formed by the long leads.

Figure 3:
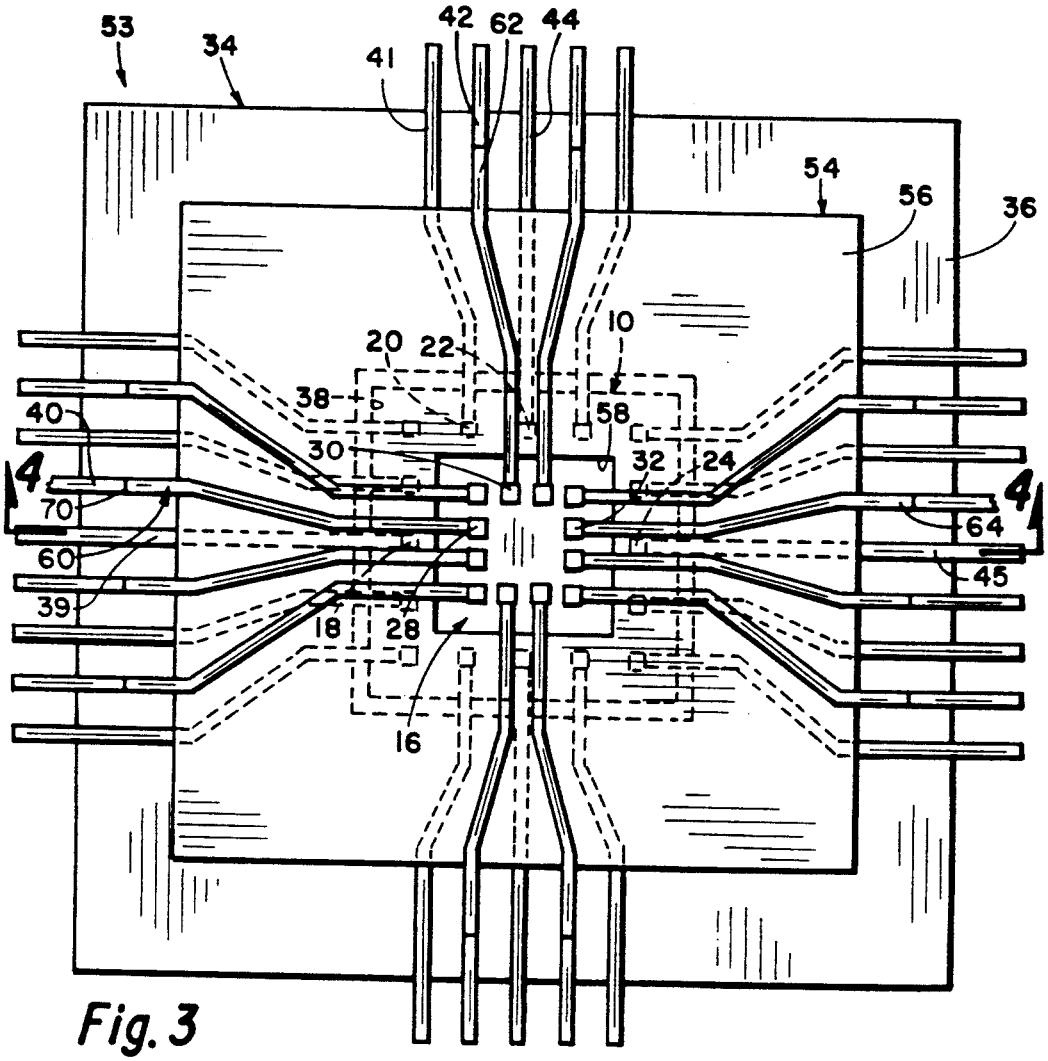
FIG. 3 is a plan view of a second lead frame connected to the structure illustrated in FIG. 2.

Turning now to FIG. 3, indicated generally at 53 is an integrated circuit and lead frame assembly constructed in accordance with the present invention. Included therein is a second lead frame 54 which is shown laid over the structure illustrated in FIG. 2. Assembly 53 includes a planar base 56 having a central opening 58 therethrough. As with base 36, base 56 comprises a polyimide film which is substantially square and concentric with square opening 58. Base 56 supports a plurality of conductive leads, like leads 60, 62, 64. Each of the leads includes an inner and outer end, like inner end 66 and outer end 68 (in FIG. 4) on lead 60. An outer extremity 70 of lead 60 is connected to trace 40 on lead frame 34 directly therebeneath. The manner of making the connection is conventional and can comprise a solder connection or one made with conductive epoxy.

Figure 4:
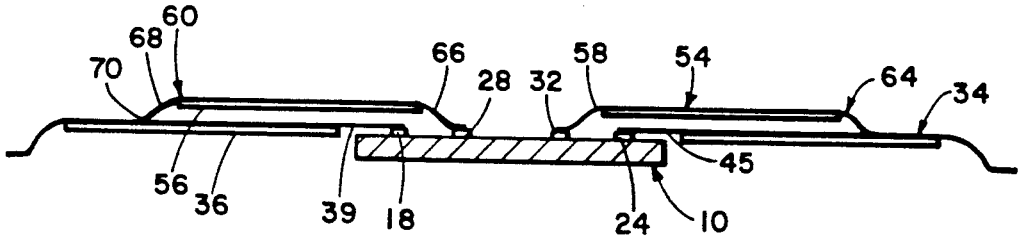
FIG. 4 is a cross-sectional view taken along 3—3 in FIG. 3.

Each of the leads on second lead frame 54 includes an inner end which extends over opening 58 and which is connected to one of the bumps which form the contact pads in second set 26, like end 66 is connected to bump 28. Each of the outer lead ends on second lead frame 54 extends over the outer edge thereof and is connected to one of the traces on first lead frame 34, like outer end 68 of lead 60 is connected to trace 40. Since bases 36, 56 are substantially planar and are parallel to one another, the outer and inner ends of the leads in second lead frame 54 include bends which extend downwardly from the lead frame to connect with the bumps. Each of the bumps in both sets 16, 26 is thus electrically connected to a different lead over one of slots 48, 50, 52, 54. The outer ends of the leads mounted on base 36 are bent as shown in FIG. 4 to facilitate attachment to a circuit board.

In constructing assembly 53, die 10 is first fabricated, in a known manner, to produce gold bumps in a first set 16 and a second set 26, best illustrated in FIG. 1. Lead frames 34, 54 and the bases 36, 56, respectively, are also manufactured using known TAB processes. Lead frame 34 is connected to die 10 by positioning the two components as illustrated in FIG. 4 with the inner ends of the leads over the first set 16 of bumps. Thereafter, the inner lead ends are gang bonded to the bumps using known gang bonding technology. As previously mentioned, the present invention can be also implemented with unbumped die and single-point bonding. With lead frame 34 and die 10 so connected to one another, lead frame 54 is positioned relative to the die and first lead frame as shown in FIG. 4. The inner ends of the leads on lead frame 54 are then connected to the bumps in set 26, via, e.g., gang bonding or single-point bonding. The outer leads on frame 54 are connected to traces, like traces 40, 42 on lead frame 34, by soldering or with conductive epoxy. Other techniques, such as single-point bonding or laser welding may be equally well used.

An integrated circuit and lead frame assembly is thus provided which increases the number of leads which can be connected to an integrated circuit.

Having illustrated and described the principle of my invention in a preferred embodiment thereof, it should be readily apparent to those skilled in the art that the invention can be modified in arrangement and detail without departing from such principles.

I claim all modifications coming within the spirit and scope of the accompanying claims:

1. An integrated circuit assembly comprising:

a single integrated circuit;

a first set of sequential contact pads mounted on said integrated circuit adjacent the perimeter thereof;

a second set of sequential contact pads mounted on said integrated circuit and spaced inwardly from said first set;

a first lead frame 34 having a plurality of leads and having the inner extremities thereof connected to said first set of sequential contact pads, said first lead frame being substantially contained in a first plane; and a second lead frame having a plurality of leads and having the inner ends thereof connected to said second set of sequential contact pads, said second lead frame being substantially contained in a second plane and spaced apart from said first lead frame.

2. The integrated circuit assembly of claim 1 wherein said first lead frame includes traces interleaved between said leads and wherein the outer ends of the leads in said second lead frame are connected to the inner extremities of said traces.

3. The integrated circuit assembly of claim 2 wherein the leads in said first lead frame are substantially planar.

4. The integrated circuit assembly of claim 3 wherein said second lead frame leads include a substantially planar portion intermediate the inner and outer lead ends substantially parallel to said first lead frame.

5. The integrated circuit assembly of claim 4 wherein an inner lead end in said second lead frame includes a bend disposed between its connection to one of said contacts and the substantially planar portion of said lead frame.

6. The integrated circuit assembly of claim 5 wherein an outer lead end in said second lead frame includes a bend disposed between its connection to one of said traces and the substantially planar portion of said lead frame.

7. The integrated circuit assembly of claim 1 wherein said first lead frame is mounted on a substantially planar base having a central opening therethrough over which the inner ends of the leads in said first lead frame extend.

8. The integrated circuit assembly of claim 1 wherein said second lead frame is mounted on a substantially planar base having a central opening therethrough over which the inner ends of the leads in said second lead frame extend.

9. An integrated circuit assembly comprising:

a single integrated circuit;

a first set of contact pads mounted on said circuit;

a second set of contact pads mounted on said circuit;

a first lead frame comprising a substantially planar array of leads having the inner ends thereof connected to said first set of contact pads;

an opening in the central portion of said array defined by the inner extremities of said leads; and a second lead frame comprising a substantially planar array of leads and having a plurality of said leads extending through said opening, said second lead frame leads being connected to said second set of contact pads and further being spaced apart from said first lead frame leads.

10. The integrated circuit assembly of claim 9 wherein said first lead frame includes traces interleaved between said leads and wherein the outer ends of the leads in said second lead frame are connected to the inner ends of said traces.

11. The integrated circuit assembly of claim 10 wherein said second lead frame leads include a substantially planar portion intermediate the inner and outer lead ends substantially parallel to said first lead frame.

12. The integrated circuit assembly of claim 11 wherein an inner lead end in said second lead frame includes a bend disposed between its connection to one of said contacts and the substantially planar portion of said lead frame.

13. The integrated circuit assembly of claim 12 wherein an outer lead end in said second lead frame includes a bend disposed between its connection to one of said traces and the substantially planar portion of said lead frame.

14. The integrated circuit assembly of claim 9 wherein said first lead frame is mounted on a substantially planar base having a central opening therethrough over which the inner ends of the leads in said first lead frame extend and through which the inner ends of the leads in said second lead frame extend.

15. The integrated circuit assembly of claim 9 wherein said second lead frame is mounted on a substantially planar base having a central opening therethrough through which the inner ends of the leads in said second lead frame extend.

16. The integrated circuit assembly of claim 9 wherein said first set of contact pads form a substantially rectangular array.

17. The integrated circuit assembly of claim 9 wherein said second set of contact pads form a substantially rectangular array.

* * * * *